United States Patent [19]

Chen

[11] Patent Number: 5,537,427
[45] Date of Patent: *Jul. 16, 1996

[54] MODULAR MULTIPLE ERROR CORRECTING CODE SYSTEM

[75] Inventor: Chin-Long Chen, Fishkill, N.Y.

[73] Assignee: International Business Machines Corporation, Armonk, N.Y.

[*] Notice: The term of this patent shall not extend beyond the expiration date of Pat. No. 5,537,423.

[21] Appl. No.: 104,294

[22] Filed: Aug. 9, 1993

Related U.S. Application Data

[63] Continuation of Ser. No. 748,155, Aug. 21, 1991.

[51] Int. Cl.$^6$ ................................................. G06F 11/10
[52] U.S. Cl. ........................ 371/37.1; 371/38.1; 371/39.1
[58] Field of Search ............................... 371/37.1, 38.1, 371/39.1, 40.1, 37.6

[56] References Cited

U.S. PATENT DOCUMENTS 4,509,172 4/1985 Chen ........................................ 371/38.1
4,556,977 12/1985 Olderdissen et al. .................. 371/37.2

*Primary Examiner*—Robert W. Beausoliel, Jr.
*Assistant Examiner*—Ly V. Hua
*Attorney, Agent, or Firm*—Lawrence D. Cutter

[57] ABSTRACT

A method for encoding and decoding signals in accordance with a class of modular coding schemes is employed. Through a representation of Galois field elements in terms of a normal basis, wherein subsequent basis entries are squares of previous entries, it is possible to construct quasi-cyclic codes capable of double error correction and triple error detection. Modularity is achieved both at the time of check bit generation and also at the time of syndrome generation. Moreover, this achievement is carried out so as to be applicable in the domain of double error correction codes. The code avoids duplication of circuitry and is efficient in terms of delay through logic gate levels. The code also provides the capability of having byte parity check indications which are helpful for isolating failures.

2 Claims, 4 Drawing Sheets

MODULAR MULTIPLE ERROR CORRECTING CODE SYSTEM

This is a continuation of application Ser. No. 07/748,155 filed on Aug. 21, 1991.

BACKGROUND OF THE INVENTION

The present invention is generally directed to apparatus and method for encoding and-decoding of binary data using error correction coding (ECC) systems which permit modular implementation. More particularly, the present invention is directed to error correction codes constructed from permuted versions of a base form of a parity check matrix.

The utilization of error correction and detection codes in electronic and data processing and information transmission systems is becoming more and more important for several reasons. In particular, increased criticality in applications and data security concerns require ever increasing levels of reliability in transmission. Furthermore, the use of high density, very large scaled integrated circuit chips for use in memory systems has increased the potential for the occurrence of soft errors such as those induced by alpha particle background radiation. Additionally, the use of integrated circuit chips has led to smaller and smaller circuits communicating and interacting at much higher information transmission rates. Accordingly, it has become more desirable to be able to protect memory and system integrity against the occurrence of transmission and storage errors. Nonetheless, as desirable as it is to incorporate error correction circuitry in various applications, it is also very desirable to insure that the correction scheme is efficient and robust while at the same time consuming a relatively small area on circuit chip devices. One of the ways of achieving this objective is to devise compact circuits which can be packaged together easily and for which the number of distinct subcircuits or parts is as small as possible. Furthermore, particularly in error correction associated with computer memory systems and other computer circuits, it is important that as little overhead time or delay cost be incurred as the result of the inclusion of error correction circuitry. Thus it is important to construct error correction circuitry both for decoding and encoding in which there are as few logic levels as possible.

In addition to all of the desirable code features that are described above that should be present in error correction coding systems, it is also desirable that the code be based upon certain well known algebraic concepts that are prevalent in the construction of error correction codes. In particular, codes which can be described as being based upon irreducible polynomials whose roots lie in a Galois field have been found to possess a number of positive qualities. A well known class of such codes are referred to as to the Bose-Chadhuri-Hocquenghem (BCH) codes. These codes are based upon parity check matrices which are formed from powers of irreducible polynomials over the binary field. Those polynomials represent field elements. The Galois field provides an extension field in which the roots can be defined, described and manipulated. The desirability of basing codes on such algebraic and systematic coding theories is that the principles developed in behalf of one code for a given application are thus readily extendable to other codes in other applications with different numbers of check, parity or information digits.

The effectiveness of a code is generally described in terms of the minimum distance that exists between code words, as measured in accordance with the Hamming distance metric. In particular, in one embodiment, the present invention is directed by way of example, toward the construction of codes which correct double errors and which detect triple errors. Such codes require a minimum code distance d of six. Such codes are referred to as double error correcting-triple error detecting (DEC-TED) codes or "d=6" codes.

SUMMARY OF THE INVENTION

In accordance with a preferred embodiment of the present invention, a parity check matrix is constructed from a set of permuted submatrices. The permutation matrix that is employed operates on each of the submatrices in a particular fashion to cause row permutations in accordance with a certain quasi-cyclic property derived from the manner in which the base parity check matrix is constructed.

The base parity check submatrix is derived in accordance with general BCH coding principles which are well known methods in the art of error correcting code design based upon Galois field theory. However, in the present situation, the applicant has employed key properties associated with a normal basis for a Galois field with the resultant discovery and application of a useful property of normal bases which properly produces quasi-cyclic properties which provide a desired degree of modularity.

The structure of the overall parity check matrix, H, may be understood in terms of the matrix used to generate syndrome bits. In this case, the base matrix is denoted as $H_1$. Thus, the overall syndrome generation matrix for code reception, based upon the code principles of the present invention, employs an overall syndrome generation matrix, $H_{syn}$, of the following form:

$$H_{syn} = [H_1 \ R \cdot H_1 \ R^2 \cdot H_1 \ R^3 H_1 \ R^3 \cdot H_1 \ldots, R^7 \cdot H_1].$$

In the above, the dot denotes matrix multiplication and the symbol R denotes a particular form of row permuting matrix. The form of the matrix R is a consequence of the way in which base matrix $H_1$ is constructed. Apart from size though, R is fixed in content. For check bit generation purposes however, it is noted that submatrix $H_1$ may be operated upon in accordance with standard elementary row operations to create more convenient forms which, for example, provide separate byte parity check indications.

Accordingly, it is an object of the present invention to construct modular error correction code systems.

It is also an object of the present invention to construct error correction coding circuitry and decoding circuitry using a small number of similar circuits with as few circuit gates as possible.

It is yet another object of the present invention to provide error correction code circuity which occupies smaller amounts of the area on a circuit chip.

It is a still further object of the present invention to provide error correction codes which are in conformance with generally recognized algebraic constructs.

It is also an object of the present invention to provide error correction systems for which the minimum distance between code words can be selected ahead of time so as to determine appropriate error correction capabilities.

It is yet another object of the present invention to provide error correction codes which are double error correcting and triple error detecting, that is, d=6 codes.

Lastly, but not limited hereto, it is an object of the present invention to reduce chip and circuit part numbers, to reduce logic delay and to provide a byte parity check mechanism.

DESCRIPTION OF THE FIGURES

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

DETAILED DESCRIPTION OF THE INVENTION

Figure 1:
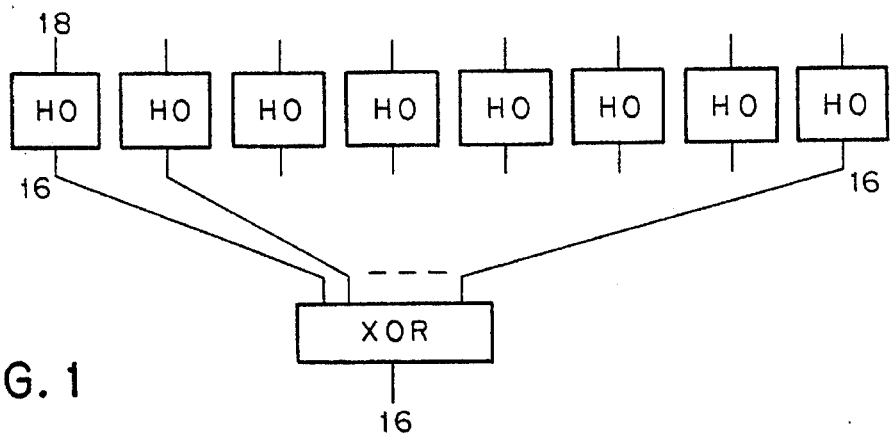
FIG. 1 is a block diagram illustrating the overall structure of logic circuity employed for error correcting code generation and also for syndrome generation circuits which particularly show the modularity aspects of the present invention.

In order to fully understand the basis for the modularity produced by the error correction code methods of the present invention, it is necessary to understand the representation of Galois field elements in terms of a normal basis. Suppose that $\alpha$ is a root of a primitive polynomial over the binary field GF(2). For the sake of example herein, an appropriate irreducible polynomial that may be employed is: $X^8+X^4+X^3+X^2+1$. It is further supposed that $\alpha$ is a root of this polynomial in $GF(2^q)$, where q is selected to be 8 solely for the example herein. Generalizations to other values of q are apparent from the example presented herein.

The elements in $GF(2^8)$ may be thought of as being seventh degree polynomials with binary value coefficients. Addition and subtraction of polynomials and multiplication by scalars are straightforward operations, the only difference being that in the underlying binary field: 0+0=0, 0+1=1, 1+0=1, but 1+1=0. A field structure is imposed upon this set of polynomials by means of polynomial multiplication in the usual sense followed by calculation of the remainder polynomial when the resultant is divided by the primitive polynomial, here $X^8+X^4+X^3+X^2+1$ (as given above). It is further supposed for this sake of discussion herein that $\alpha$ is selected to be a root of this polynomial in the extension field, namely $GF(2^8)$. Now a power of $\alpha$ is selected. For the sake of example herein, $\beta$ is selected to be $\alpha^{39}$. It is seen that repeated squaring of this particular power of $\beta$ results in a cyclic sequence of powers: $\alpha^{39}$, $\alpha^{78}$, $\alpha^{156}$, $\alpha^{57}$, $\alpha^{114}$, $\alpha^{228}$, $\alpha^{201}$, $\alpha^{147}$. In terms of powers of $\beta(=\alpha^{39})$ this sequence is: $\beta$, $\beta^2$, $\beta^4$, $\beta^8$, $\beta^{16}$, $\beta^{32}$, $\beta^{64}$ and $\beta^{128}$. In general then it is seen that the powers of $\beta$ are then describable as $\beta^{2^i}$. This set, $\{\beta, \beta^2, \beta^4, \beta^8, \beta^{16}, \beta^{32}, \beta^{64}, \beta^{128}\}$, acts as a normal basis for a vector space of dimension 8 whose 8-tuple elements are selected from the set of coefficients of seventh degree (or less) monic polynomials from the Galois field. In particular, this set forms a normal basis with special properties relating to squares of elements in $GF(2^q)$. In particular, if p is any seventh degree polynomial with binary coefficients it may be represented as follows:

$$p = \sum_{i=0}^{7} a_i \beta^{2^i}. \tag{1}$$

The normal basis selected has the following important property which forms the basis for the construction of codes in accordance with the present invention. In particular, it is seen that the square of field elements may be written as follows in terms of the selected normal basis:

$$p^2 = \sum_{i=0}^{7} a_i \beta^{2^{i+1}} = \sum_{i=0}^{7} a_{i-1} \beta^{2^i}. \tag{2}$$

In the above, it should be noted that by definition $a_{-1}=a_7$. Accordingly, this relationship produces the following result for a given set of coefficients for p. In particular, if p is characterized by the column vector of coefficients $(a_0, a_1, \ldots, a_7)$, then the value of $p^2$ is given by the column vector $(a_7, a_0, \ldots, a_6)$. It is therefore important to realize that powers of field elements are readily constructed by so-called "end-around shift" operations. That is to say, a permutation of the coefficients of p by one position, in the appropriate direction, produces coefficients for the square of the field element.

This is an important result since the powers of field elements play a significant role in the construction of matrices based upon BCH coding methods. For example, it is well known that parity check matrices may be constructed from Galois field elements in the following fashion:

$$H = \begin{bmatrix} 1 & \beta^1 & \beta^2 & \ldots & \beta^i & \ldots \\ 1 & \beta^3 & \beta^6 & \ldots & \beta^{3i} & \ldots \\ 1 & \beta^5 & \beta^{10} & \ldots & \beta^{5i} & \ldots \\ \cdot & \cdot & & & \cdot & \\ \cdot & \cdot & & & \cdot & \\ \cdot & \cdot & & & \cdot & \end{bmatrix} \tag{3}$$

If, as described above, the $\beta$ is represented in a normal basis, the formation of various subparts of the parity check matrix become much easier, and depending upon the degree of error correction selected, one can produce cyclic or quasi-cyclic codes as a result. In particular, an important aspect of this invention is that quasi-cyclic codes result from the selection of the first two rows in equation (3). This allows the construction of parity check matrices for generation of check bits and also for the generation syndrome bits based upon permuted base matrices to be able to correct double errors and detect triple errors.

In the example provided above, the power of $\beta$ selected as a foundation for the normal basis was $\alpha^{39}$. However, other powers of $\alpha$ could be chosen Some of these powers of $\alpha$ will yield parity check matrices with fewer or greater numbers of ones in the respective matrix columns. Since it is generally desirable to employ parity check matrices with a low number of ones in the array, a method for constructing sets of powers of $\alpha$ for which this is desirable, is provided in more detail below to produce a certain amount of optimization within the set of modular codes that are possible in accordance with the present invention. It should also be noted that the particular primitive polynomial and value of q selected above was arbitrary and that the methods of the present invention are nonetheless applicable to other values for q and for other irreducible polynomials other than $X^8+X^4+X^3+X^2+1$. It is seen from the equations above that a parity check matrix for a d=6 code may be constructed from a parity check matrix $H_{ECC}$ of the following form:

$$H_{ECC} = [H_0 \ R \cdot H_0 \ \ldots \ R^2 \cdot H_0 \ \ldots \ R^7 \cdot H_0] \tag{4}$$

where $H_0$ is derived from $H_1$ through elementary matrix operations.

In accordance with the example indicated above, the methods of the present invention are now employed to construct a (144,128) code from a plurality of submatrices with 16 rows and 18 columns.

There are two aspects to the construction of overall parity check matrices in accordance with the present invention. One aspect deals with the construction of base matrices, referred to herein as either $H_1$ or $H_0$. The other aspect concerns the structure and effect produced by the matrix R and its powers.

Attention is first directed to the construction of the matrix R and the import to be attached to its structure. The structure of matrix R is esentially that it is a limited type of permutation matrix. It is this structure which contributes to the resulting code being quasi-cyclic in nature and produces the modular properties. As pointed out above, when rendered in a normal basis, field elements may be expressed as sequences of zeroes and ones (coefficients of polynomials actually), but most importantly, squares of field elements may be expressed as shifted representations of the zeroes and ones. In particular, if p is a field element represented by the sequence of coefficients $(a_0, a_1, \ldots, a_7)$ then in the normal basis representation, the corresponding coefficient represent for $p^2$ would be $(a_7, a_0, \ldots, a_6)$. It is to be noted that this is, in this form, a simple end around shift of coefficients, that is a permutation of the coefficients $a_i$ which are zeroes and ones.

For the (144,128) code example described herein, R is the following 16×16 matrix:

$$R = \begin{bmatrix} 00000001 & 00000000 \\ 10000000 & 00000000 \\ 01000000 & 00000000 \\ 00100000 & 00000000 \\ 00010000 & 00000000 \\ 00001000 & 00000000 \\ 00000100 & 00000000 \\ 00000010 & 00000000 \\ 00000000 & 00000001 \\ 00000000 & 10000000 \\ 00000000 & 01000000 \\ 00000000 & 00100000 \\ 00000000 & 00010000 \\ 00000000 & 00001000 \\ 00000000 & 00000100 \\ 00000000 & 00000010 \end{bmatrix}$$

If $r_1, r_2, \ldots, r_{16}$ are the row vectors from top to bottom of a parity check matrix, then by pre-multiplying this parity check matrix by R then the resulting matrix has the rows $r_8, r_1, r_2, \ldots, r_7, r_16, r_9, r_{10}, \ldots, r_{15}$. In other words, the row vectors of R·H are single cyclic permutations of the first 8 rows and the last 8 rows of H in the specified shifting direction. The significance here is that there is a one to one correspondence between permuting rows in this fashion and constructing powers of field elements when those field elements are represented in terms of a normal basis.

A particularly desirable base matrix $H_0$ which is useful for the construction of parity check matrices, as opposed to their counterpart syndrome generation matrices, is the matrix given below as $H_0$:

$$H_0 = \begin{bmatrix} 10 & 11111111 & 00000000 \\ 00 & 11110000 & 00001110 \\ 00 & 00011100 & 10101001 \\ 00 & 00101100 & 10001111 \\ 00 & 10011100 & 10101010 \\ 00 & 11001001 & 11000001 \\ 00 & 01100011 & 10001100 \\ 00 & 00000111 & 00011011 \\ 01 & 00000000 & 11111111 \\ 00 & 11010000 & 11110000 \\ 00 & 10100000 & 11001000 \\ 00 & 00101101 & 11100010 \\ 00 & 10010100 & 01111000 \\ 00 & 11110010 & 01000001 \\ 00 & 01001101 & 00110000 \\ 00 & 10000111 & 00001111 \end{bmatrix}$$

The matrix $H_0$ is derived from a matrix $H_1$ by means of elementary row and column operations and is displayed with spacing to emphasize its byte checking capability. In this particular example shown, matrix $H_1$ has 16 rows and 18 columns. This is due in part to the fact that in the particular example the base matrix is constructed to be a double error correcting code. More particularly, the base matrices of the present invention, when used for double error correction codes, are constructed from the following form:

$$H_1 = \begin{bmatrix} \alpha^i \\ \alpha^{3i} \end{bmatrix}. \tag{4}$$

In the present instance, if only single error correction is desired, then R is constructed from an 8×8 array of zeroes and ones. In short, the R matrices in accordance with the present invention comprise a square array of submatrices which are also square. All off diagonal submatrices are zeroes and all of the submatrices which are diagonally disposed are of the form shown in the R matrix below. In particular, the relevant submatrix produces a single permutation of the rows of a parity check submatrix. Thus, the submatrices of the R matrices, constructed in accordance with the present invention, are of the form:

$$R = \begin{bmatrix} 00000001 & 00000000 \\ 10000000 & 00000000 \\ 01000000 & 00000000 \\ 00100000 & 00000000 \\ 00010000 & 00000000 \\ 00001000 & 00000000 \\ 00000100 & 00000000 \\ 00000010 & 00000000 \\ 00000000 & 00000001 \\ 00000000 & 10000000 \\ 00000000 & 01000000 \\ 00000000 & 00100000 \\ 00000000 & 00010000 \\ 00000000 & 00001000 \\ 00000000 & 00000100 \\ 00000000 & 00000010 \end{bmatrix}$$

In the particular case illustrated, namely that of a (144, 128) code, the resultant code is quasi-cyclic in that different parts of the parity check matrix are separately permuted in accordance with the powers of the R matrix. In particular, the row vectors of R·H₀, as supplied above, are independent cyclic permutations of the first 8 rows and the last 8 rows of H₀. For example, R³·H₀ is also a row permutation of H₀. In particular, it is easily seen that this permutation, for the H₀ provided above, is the following:

$$R^3 \cdot H_0 = \begin{bmatrix} 00 & 11001001 & 11000001 \\ 00 & 01100011 & 10001100 \\ 00 & 00000111 & 00011011 \\ 10 & 11111111 & 00000000 \\ 00 & 11110000 & 00001110 \\ 00 & 00011100 & 10101001 \\ 00 & 00101100 & 10001111 \\ 00 & 10011100 & 10101010 \\ 00 & 11110010 & 01000001 \\ 00 & 01001101 & 00110000 \\ 00 & 10000111 & 00000111 \\ 01 & 00000000 & 11111111 \\ 00 & 11010000 & 11110000 \\ 00 & 10100000 & 11001000 \\ 00 & 00101101 & 11100010 \\ 00 & 10010100 & 01111000 \end{bmatrix}$$

It is clearly seen that the matrix provided above is a permutation of the first 8 rows of H₀ and the last 8 rows of H₀. Because the overall parity check matrix $H_{syn}$ given above is obtained from the base matrix H₀ and its permutations, it is easy to construct parity check circuits in modular form. This construction is discussed further and is more particularly illustrated below and in FIG. 1.

In practice, matrix H₀ is obtained from matrix H₁ whose construction is even more particularly illustrated below. However, for the purpose of constructing circuits for generating parity check bits, it is desirable to manipulate the resultant H₁ matrix into a form similar to that shown for H₀ above. In particular, the first two columns are all zeroes except for what is equivalent to a 2×2 identity matrix in rows 1 and 9. Furthermore, rows 1 and 9 in H₀ are preferably constructed so as to otherwise include a contiguous uninterrupted string of eight "1"s followed by a similar string of eight "0"s. In the ninth row the strings of zeroes and ones are reversed, as shown in the matrix H₀ above. In this way, it should be noted that the first and ninth rows of H₀ represent byte parity check bit generation. This is very convenient because information handling systems typically handle and transmit information on a byte basis. Thus byte parity checking in this fashion is readily usable for error detection and failure isolation purposes during checking operations. Also, for this matrix it is noted that the number of two-way Exclusive-OR levels is six as opposed to a higher order number of circuit levels for error verification. The generation of parity check bits is straightforward from the definition of the parity check matrix $H_{ECC}$. Because $H_{ECC}$, as described above, is obtained from the base matrix H₀ and its permutations, a 16 output Exclusive OR tree can be replicated eight times for parity check bit generation. It is this replication which produces the modular aspects of the present code and results in at least some of its advantages.

Attention is now directed to the construction of parity check submatrices H₀ and H₁ in accordance with the present invention. It is noted herein to a certain extent the form of the R matrix and the number of powers of the R matrix that are employed are dependent at least as to size on the structure, and particularly the algebraic structure of the H₀ or H₁ matrices. However, attention is now particularly focused upon the construction of an H₁ matrix which is useful in the generation of syndrome vectors which are generated by circuitry at that portion of the data transmission path which receives code word sequences and generates syndrome vectors for error correction purposes and also for the purpose of providing indications that an uncorrectable error (UE) has occurred.

As indicated above, one starts with a primitive polynomial over the binary field and uses that to construct a Galois field with $2^q$ elements. One selects a root of the irreducible polynomial and uses that to construct a normal basis consisting of squares of the selected field elements so as to construct a field representation. For example, in the above example, if the root selected is designated as $\alpha$ and $\alpha^{39}$ is used to form a normal basis it is readily appreciated that each element in the Galois field GF(2⁸) can be β represented as a linear combination of elements $\beta, \beta^2, \beta^4, \beta^8, \beta^{16}, \beta^{32}, \beta^{64}$ and $\beta^{128}$. It is this selection of squared powers and the observation of its effect on the coefficients that produces the desired modular structure for codes in accordance with the present invention.

In order to fully appreciate the powers of the field element representations of that are employed in the construction of the H₀ and H₁ matrices, it is important to define a particular concept and to consider a particular set of integers. In particular, for a field element in GF($2^q$) (here q=8) called p the trace of p, Tr(p), is defined as follows:

$$Tr(p) = \sum_{i=0}^{7} p^{2^i}. \tag{6}$$

With this definition of the trace of a field element the following set I of 18 integers is defined:

$$I=\{11,19,184,7,134,143,39,169,40,198,232,214,111,81, 254,95,129, 150\}$$

Syndrome generating matrices of the present invention are then constructed of the following form:

$$H_I = \begin{bmatrix} \alpha^i \\ \alpha^{3i} \end{bmatrix}$$

where i belongs to the integers in the set I.

One special property of I is that the traces Tr($\alpha^{3i}$)=1. This is particularly important in the code construction. The BCH coding theory says that the code constructed from H₁ has d=5. Thus, the code is a double error correcting code without full triple error detecting ability. An additional check bit would be required to construct a d=6 code. The fact that the traces Tr($\alpha^{3i}$) are equal to 1 guarantees that each binary 8-triple representation of $\alpha^{3i}$ in a normal basis has an odd number of ones. This implies that the code constructeed has d=6. Thus, H₁ defines a d=6 code without the requirement of adding an additional check bit. In particular, in the above, it is preferable to pick i=11 and i=19 to be check bits to minimize the number of Exclusive-OR circuits for error correction code word generation. For these particular values of $\alpha$, as generating field elements an appropriate syndrome generation matrix H₁ is formed. Note that since there are 18 elements in the set I, there are 18 columns in the syndrome generating matrix H₁. Likewise, since each column of H₁ includes two elements from the underlying field GF2⁸), the matrix H₁ has 16 rows (8 for each field element). For this particular case, it is desirable to pick the columns containing $\alpha^{11}$ and $\alpha^{19}$ to act as check bit columns. This selection reduces the number of Exclusive-OR circuits that are employed for code word generation.

The ordering of the integers in I is arranged so that the first and ninth rows of $H_0$ represent byte parity check bit generation. As suggested above, different selection criteria are appropriate for parity check matrices used in the generation of syndrome vectors for proper decoding. In the case of the irreducible polynomial listed above and the selection of $\alpha^{39}$ as the foundation for a normal basis, and with the utilization of the set I as provided above, the resultant $H_1$ matrix usable in accordance with the present invention is given as follows:

$$H_I = \begin{bmatrix} 0101001101100000001 \\ 110101011111001000 \\ 000110000100111101 \\ 101000010111000001 \\ 111010011001111111 \\ 100001011101111000 \\ 001001011001001100 \\ 111101011100101010 \\ 100101000111000011 \\ 001101100001110011 \\ 001000000111000110 \\ 010001110110001100 \\ 100001111000001100 \\ 100000001010010000 \\ 100101101011010010 \\ 101010110001001011 \end{bmatrix}$$

The matrix $H_I$ is readily transformed into the matrix $H_0$ shown above by elementary row and column operations. The form of the matrix $H_0$ is most appropriate for parity check generation purposes while the matrix in the form $H_1$ is more appropriate for syndrome generation purposes.

Because the columns of $H_1$ are represented in terms of a normal basis, it is possible to construct larger parity check and syndrome generation matrices using the matrices R as described above. Thus there is a cooperative relationship between the field elements used to construct $H_1$ and the permutation of matrices R which impose a quasi-cyclic structure. Accordingly, it is seen that a significant aspect of the present invention is the interaction and cooperation that exists between the R matrices and the matrices $H_1$ or the matrices $H_0$ constructed from $H_1$ by elementary matrix operations. The desired resultant parity check generating matrix is thus provided above in equation (4). A correspondingly appropriate syndrome generating matrix is thus as described below:

$$H_{syn} = [H_1 \; R \cdot H_1 \; R^2 \cdot H_1 \; \ldots \; R^7 \cdot H_1].$$

Figure 2:
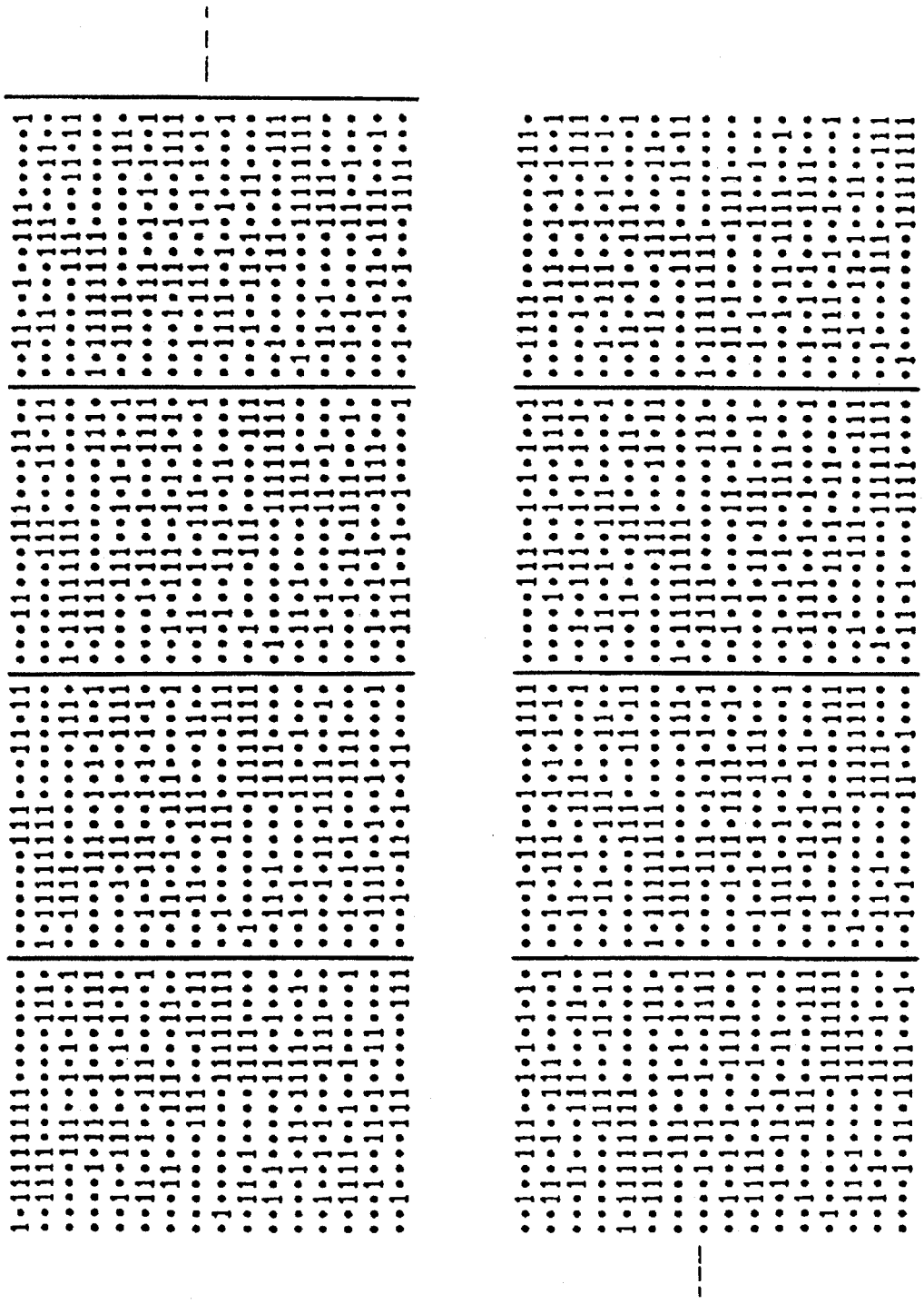
FIG. 2 illustrates a particular form for a parity check matrix in accordance with the present invention for an (n,k) code where n=144 and k=128.
Figure 3:
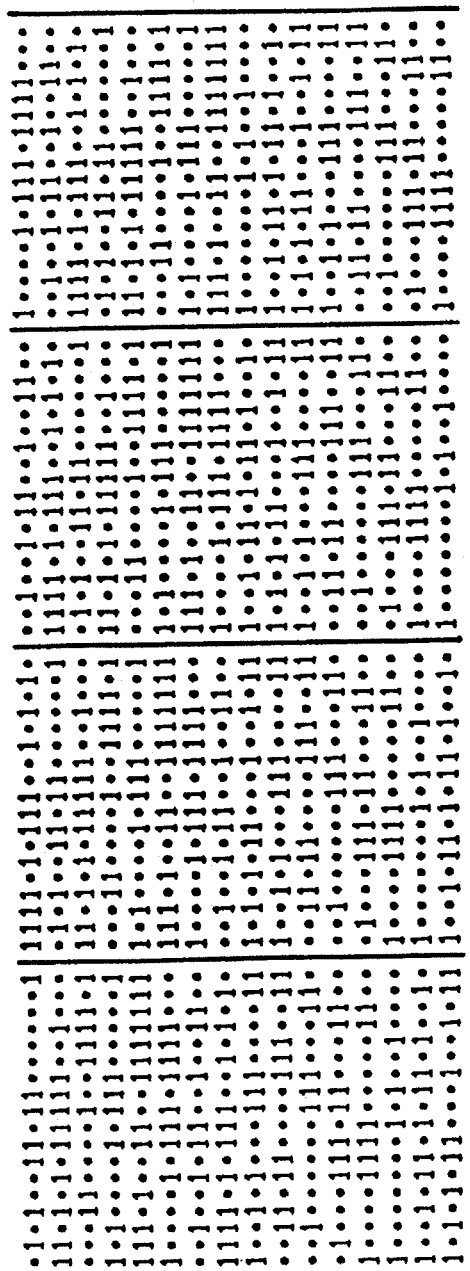
FIG. 3 illustrates a similar parity check matrix which is particularly useful for syndrome generation.
Figure 3:
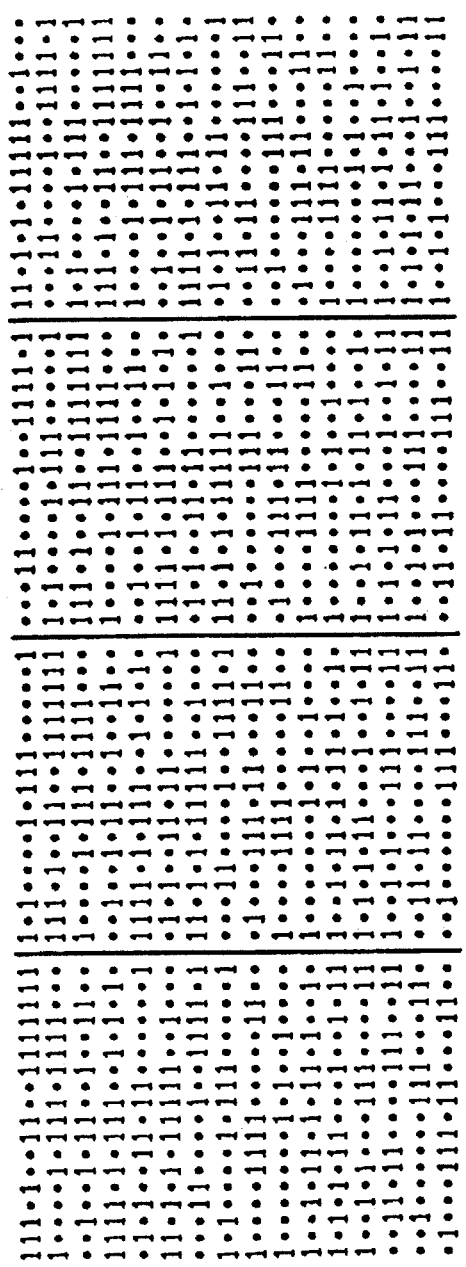

When fully expanded for the specific case being illustrated herein as an example, the parity check generating matrix $H_{ECC}$ that results is shown in fully expanded form in FIG. 2. In a similar fashion the fully expanded syndrome generating matrix $H_{syn}$ constructed in accordance with the present example and the principles taught by the present invention results in the fully expanded matrix shown in FIG. 3.

Figure 4:
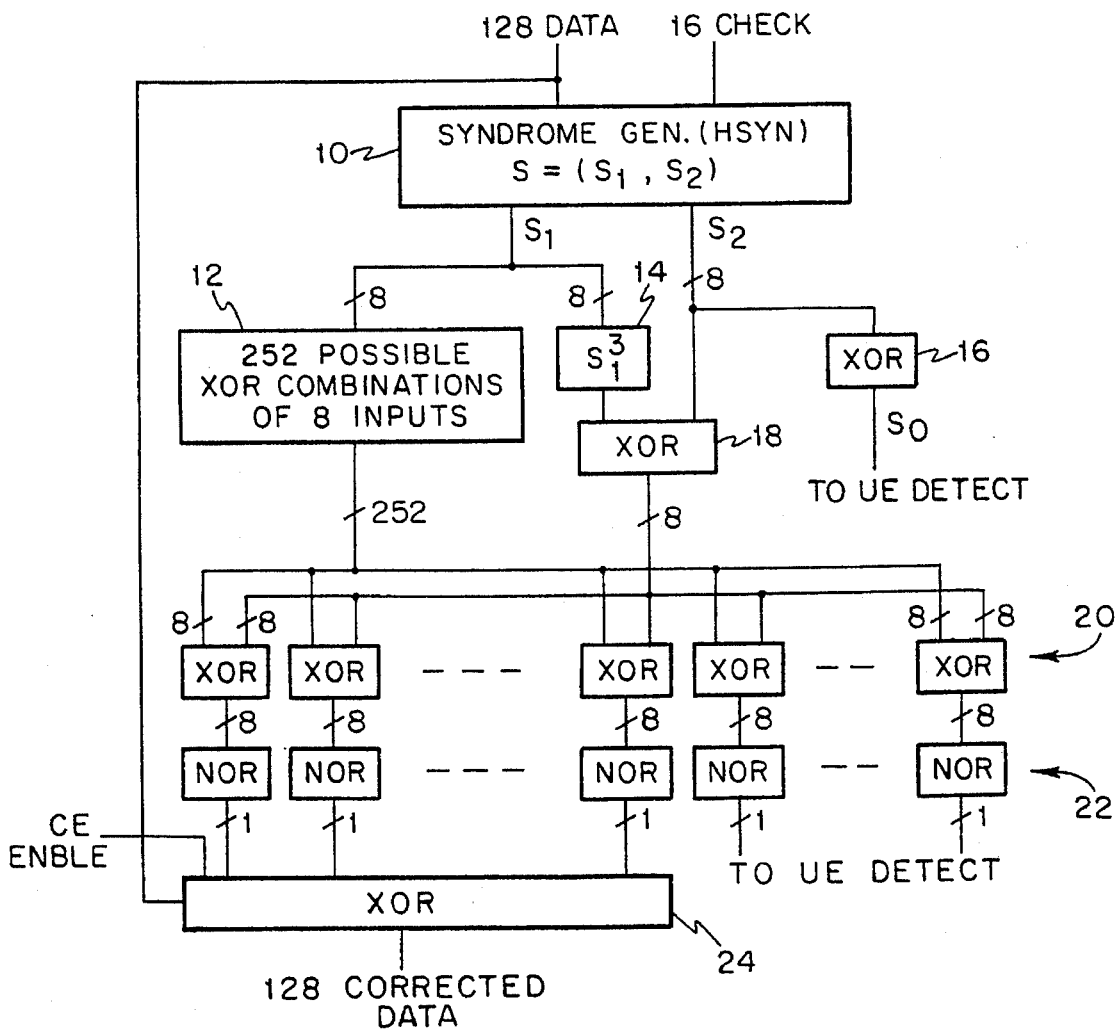
FIG. 4 is a block diagram of a circuit which may be employed for error correction for the example code employed illustratively herein.

The circuit modularity of the present code is illustrated in FIG. 1. In particular, it is seen that only one circuit, namely the circuit which implements $H_1$ or $H_0$, needs to be employed. There are 8 such separate circuits for the code example chosen resulting in a total input of 144 input bit positions. These may be to produce a 16 bit syndrome vector as shown, in accordance with well understood principles of coding theory. A similar circuit diagram is applicable to parity check generation. Furthermore, because of the structure of the present code it is possible to generate both check bits and syndrome bits in a modular fashion. This is a unique feature of the present system of codes that are constructed in accordance with the present invention. A desirable method and apparatus for providing error correction in accordance with codes of the form described herein is shown in FIG. 4. In particular, the method illustrated is based upon the detection method shown in U.S. Pat. No. 4,556,977 issued Dec. 3, 1985 to Ulrich Olderdissen and Hans Schumacher and assigned to the same assignee as the present invention. Accordingly, the contents of the aforementioned issued patent are hereby incorporated herein by reference. As in the case of the cited patent, the circuit shown in FIG. 4 is designed for double error correction-triple error detection codes, that is, d=6 codes.

In particular, it is seen in FIG. 4 that the full set of 128 data bits and 16 check bits are provided to syndrome generator 10, which is constructed in accordance with well known principles typically using Exclusive-OR gates and employing, in this case, a matrix of 144 columns and 16 rows. The output of this circuit is a syndrome vector, the first 8 bits of which are designated $S_1$ and the second 8 bits of this vector being designated as $S_2$. The 8 $S_2$ bits are provided to Exclusive-OR tree 16 to generate $S_0$ which indicates an odd number of errors. The 8 $S_2$ bits are also supplied to Exclusive-OR block 18. The other input signal to Exclusive-OR block 18 is discussed below.

The first 8 bits of syndrome S, namely $S_1$, are supplied to two circuits. Firstly, $S_1$ is directed to a bank of 252 Exclusive-OR trees which generate 252 of the 256 possible combinations of the 8 leading syndrome bits $S_1$. The four patterns excluded are all zeros, all ones, the (10101010) and (01010101) 8-triples. Leading syndrome bits $S_1$ are also directed to the circuit 14 labeled $S_1^3$. Circuit 14 performs an ANDing and Exclusive-ORing operation to generate the third power of the first 8 syndrome bits. If these bits are denoted by the reference numerals 0 through 7, then the following table describes the circuit which is implemented in block 14:

TABLE I

| AND | XOR |
|---|---|
| 0 0 | 0 1 0 1 1 0 1 1 |
| 0 1 | 1 1 1 0 0 0 0 1 |
| 0 2 | 1 0 0 0 1 0 0 1 |
| 0 3 | 0 0 0 0 1 1 1 0 |
| 0 4 | 0 0 1 1 0 0 1 1 |
| 0 5 | 0 1 1 1 0 0 0 0 |
| 0 6 | 0 0 1 0 0 1 1 0 |
| 0 7 | 1 1 0 0 0 0 1 1 |
| 1 1 | 1 0 1 0 1 1 0 1 |
| 1 2 | 1 1 1 1 0 0 0 0 |
| 1 3 | 1 1 0 0 0 1 0 0 |
| 1 4 | 0 0 0 0 0 1 1 1 |
| 1 5 | 1 0 0 1 1 0 0 1 |
| 1 6 | 0 0 1 1 1 0 0 0 |
| 1 7 | 0 0 0 1 0 0 1 1 |
| 2 2 | 1 1 0 1 0 1 1 0 |
| 2 3 | 0 1 1 1 1 0 0 0 |
| 2 4 | 0 1 1 0 0 0 1 0 |
| 2 5 | 1 0 0 0 0 0 1 1 |
| 2 6 | 1 1 0 0 1 1 0 0 |
| 2 7 | 0 0 0 1 1 1 0 0 |
| 3 3 | 0 1 1 0 1 0 1 1 |
| 3 4 | 0 0 1 1 1 1 0 0 |
| 3 5 | 0 0 1 1 0 0 0 1 |
| 3 6 | 1 1 0 0 0 0 0 1 |
| 3 7 | 0 1 1 0 0 1 1 0 |
| 4 4 | 1 0 1 1 0 1 0 1 |
| 4 5 | 0 0 0 1 1 1 1 0 |

TABLE I-continued

| AND | XOR |
|---|---|
| 4 6 | 1 0 0 1 1 0 0 0 |
| 4 7 | 1 1 1 0 0 0 0 0 |
| 5 5 | 1 1 0 1 1 0 1 0 |
| 5 6 | 0 0 0 0 1 1 1 1 |
| 5 7 | 0 1 0 0 1 1 0 0 |
| 6 6 | 0 1 1 0 1 1 0 1 |
| 6 7 | 1 0 0 0 0 1 1 1 |
| 7 7 | 1 0 1 1 0 1 1 0 |

Figure 5:
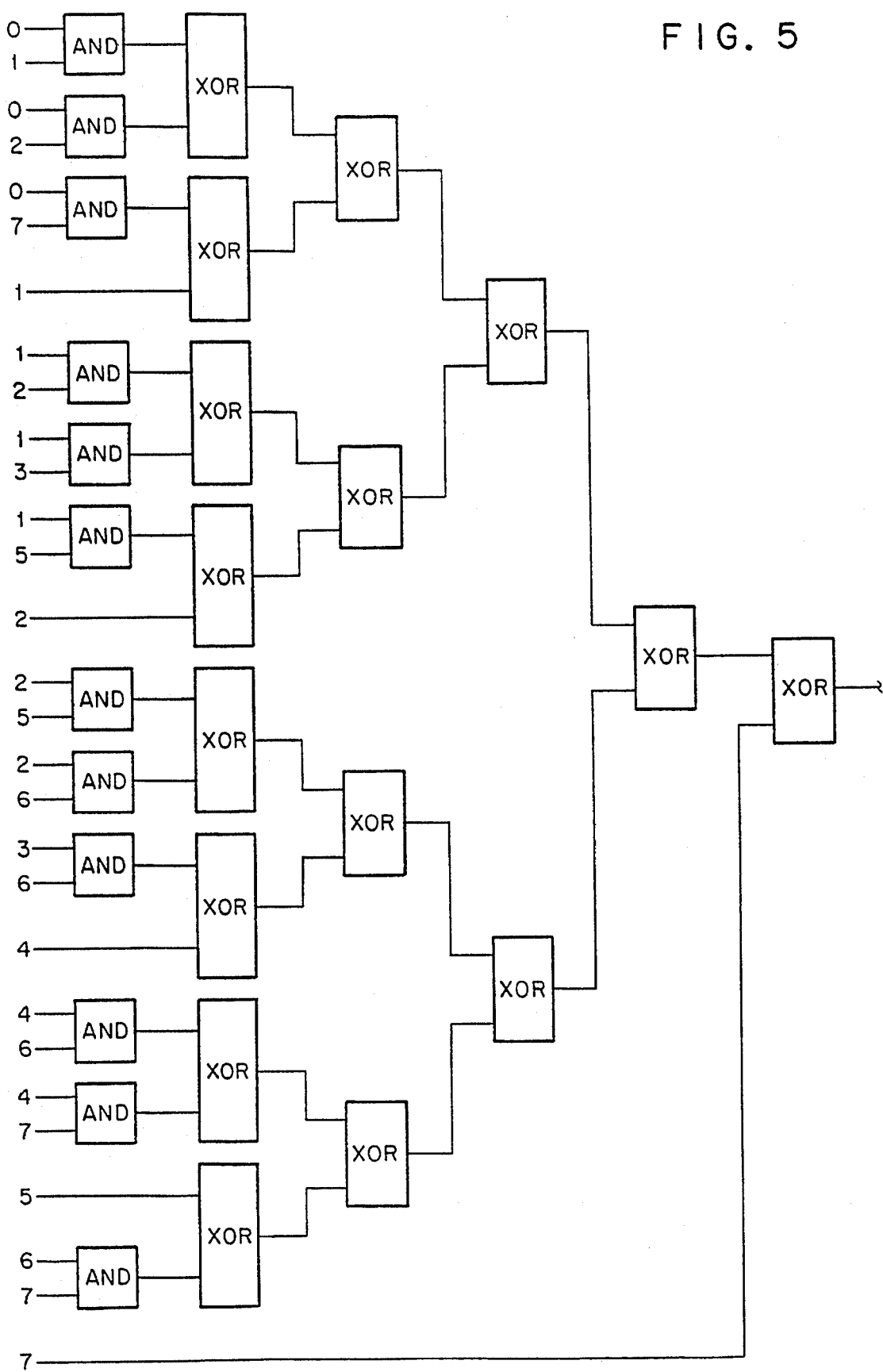
FIG. 5 is a logical block diagram illustrating the structure of the S matrix and also the circuit constructed from the table herein describing the calculation of $S^3$.

Each column in the XOR portion of Table I above represents a circuit having a single bit output. Each row of the table represents a pair of bits from $S_1$, of which there are a total of 8, here labeled from 0 through 7. Each element in the XOR portion of the table is either a 0 or a 1 indicating whether or not that particular pair of bits from $S_1$ is to be ANDed together. All of the pair which are ANDed together, as indicated by the 1's appearing in any given column of the XOR portion of the table, are fed through an Exclusive-OR tree. If the pair of bits are identical, the AND gate can be omitted. In particular, in the first column of the Exclusive-OR portion of the table above, the circuit shown in FIG. 5 is produced. Other circuits are constructed in the same fashion for the remaining seven columns in the XOR portion of the table except for the labeling of inputs. The inputs to other copies of the circuits are those shown in FIG. 5, the only difference being that 1, 2, ... 7 are added to the input labels (modulo 7). Here two-way Exclusive-OR gates are employed. However, this is only for convenience and is not necessarily a required aspect of the present invention. Thus circuit block 14 designated $S_1^3$ is implemented from a set of 8 circuits each being similar to the one shown in FIG. 5. These eight bit lines emerging from block 14 are supplied to Exclusive-OR gates arranged in a bank in block 18 wherein corresponding 1's of the signal lines from block 14 are Exclusive-ORed in pair-wise fashion with the 8 bits from the second half of syndrome generating block 18.

The output signals from block 12 are supplied in groups of 8 bits to Exclusive-OR gates in bank 20 of such gates. The other 8 bits that are supplied to gates in bank 20 are supplied from the set of Exclusive-OR gates in block 18, as shown. The two sets of 8 input signal lines to each gate in bank 20 are Exclusive-ORed together to produce a set of 8 output signal lines from each XOR gate. These eight XOR gate output lines are in turn supplied to a NOR gate so that there is a "1" output from the NOR gates only when the sets of eight-triples supplying the XOR gates in bank 20 are identical. In block 24, only 128 data bits are fed into the inverter (XOR gates). The 16 check bits are not inverted if they are in error. However, all 128+16=144 outputs of comparator 22 are used to generate an uncorrectable error (UE) signal which is logically expressed as:

UE = [$S_0$ AND (outputs of block 18 are not all zero)]

OR

[(syndrome not all zero) AND ($S_0 = 0$) AND (none or odd number of the 144 outputs of block 22 is on)]

Accordingly, it is seen that not only are codes of the present invention readily implemented in terms of parity check and syndrome matrices, it is also easy to provide the desired degree of double error correction and triple error detection. It is seen that the system of the present invention results in a code with many unique properties. In particular, logic delays are reduced by minimizing the number of 1's in the respective matrices, but most importantly, the circuits employed may be constructed in a modular fashion and are replicated multiple times, with the only variation being in the signal lines which are fed to the circuit blocks. In short, the code is highly modular. Additionally, the code provides a mechanism for producing byte parity checks on individual code words. The code is also double error correcting and triple error detecing, a desirable code property, especially where high degrees of data reliability are desired in computer systems, and more particularly in computer memory systems.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. An electrical circuit for encoding input digital electrical signals representing binary data so as to produce output digital electrical check bit signals which satisfy linear constraint conditions determined by a parity check matrix H of the form $$H=(H_0, R \cdot H_0, R^2 \cdot H_0, R^3 \cdot H_0, \ldots, R^7 \cdot H_0),$$

wherein $H_0$ is the following matrix

```
1 0 1 1 1 1 1 1 1 1 0 0 0 0 0 0 0 0
0 0 1 1 1 1 0 0 0 0 0 0 0 0 1 1 1 0
0 0 0 0 0 1 1 1 0 0 1 0 1 0 1 0 0 1
0 0 0 0 1 0 1 1 0 0 1 0 0 0 1 1 1 1
0 0 1 0 0 1 1 1 0 0 1 0 1 0 1 0 1 0
0 0 1 1 0 0 1 0 0 1 1 1 0 0 0 0 0 1
0 0 0 1 1 0 0 0 1 1 1 0 0 0 1 1 0 0
0 0 0 0 0 0 0 1 1 1 0 0 0 1 1 0 1 1
0 1 0 0 0 0 0 0 0 0 1 1 1 1 1 1 1 1
0 0 1 1 0 1 0 0 0 0 1 1 1 1 0 0 0 0
0 0 1 0 1 0 0 0 0 0 1 1 0 0 1 0 0 0
0 0 0 0 1 0 1 1 0 1 1 1 1 0 0 0 1 0
0 0 1 0 0 1 0 1 0 0 0 1 1 1 1 0 0 0
0 0 1 1 1 1 0 0 1 0 0 1 0 0 0 0 0 1
0 0 0 1 0 0 1 1 0 1 0 0 1 1 0 0 0 0
0 0 1 0 0 0 0 1 1 1 1 0 0 0 0 0 1 1 1,
``` and wherein R is a permutation matrix representing a single shift, both in the first eight and last eight rows of $H_0$.

2. An electrical circuit for encoding input digital electrical signals representing binary data so as to produce output digital electrical check bit signals which satisfy linear constraint conditions determined by a parity check matrix H of the form $$H=(H_1, R \cdot H_1, R^2 \cdot H_1 \ldots R^{2^q-1}H_1)$$

wherein R is a single step permutation matrix, and wherein $H_1$ is binary matrix of the form $$H_l = \begin{bmatrix} \alpha^i \\ \alpha^{3i} \end{bmatrix}$$

wherein i belongs to the set for which $\text{Tr}(\alpha^{3i})=1$ and $i=\min_j i2^j \mod 2^q-1$, and wherein $\alpha$ is a primitive root of a polynomial over $GF(2^q)$.

* * * * *